(12) United States Patent
Oppelt (10) Patent No.: US 7,098,719 B2
(45) Date of Patent: Aug. 29, 2006

(54) MULTIPLEXER WITH CLOCK SUPPRESSION

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 35 days.

(21) Appl. No.: 10/960,649

(22) Filed: Oct. 8, 2004

(65) Prior Publication Data

US 2005/0077946 A1 Apr. 14, 2005

(30) Foreign Application Priority Data

Oct. 9, 2003 (DE) .................. 103 47 640
Sep. 15, 2004 (DE) .............. 10 2004 044 740

(51) Int. Cl.
*H03K 17/62* (2006.01)

(52) U.S. Cl. .................. 327/407; 327/408; 327/410

(58) Field of Classification Search .............. None
See application file for complete search history.

(56) References Cited

U.S. PATENT DOCUMENTS

| | | | |
|---|---|---|---|
| 3,235,840 A | 2/1966 | Sturm | 340/14.65 |
| 3,614,668 A * | 10/1971 | Sudoh | 332/178 |
| 3,636,478 A * | 1/1972 | Glock | 332/152 |
| 3,689,710 A | 9/1972 | Colardelle et al. | 179/170 D |
| 3,931,475 A | 1/1976 | Bachle et al. | 179/118 |
| 3,986,146 A * | 10/1976 | Parkhideh et al. | 332/168 |
| 4,317,230 A * | 2/1982 | Boubouleix | 455/319 |
| 4,412,252 A * | 10/1983 | Moore et al. | 348/580 |
| 5,097,229 A * | 3/1992 | Forge | 332/115 |
| 6,922,092 B1 * | 7/2005 | Stark et al. | 327/170 |

FOREIGN PATENT DOCUMENTS

DE 38 08 036 9/1989

OTHER PUBLICATIONS

Analog Devices, "2.5 Quad SPST Switches in Chip Scale Package ADG781/ADG/782/ADG783," Rev. A, 2002, pp. 1-8.
Maxim, "±15kV ESD-Protected, Low-Voltage, CMOS Analog Multiplexers/Switches", 1999, pp. 1-16.
Zinke, Brunswig, Hochfrequenztechnik 2, 5th Ed., 1999, pp. 492-494.
U. Tietze et al., "Halbleiter-Schaltungstechnik," 1990, pp. 501-502.

* cited by examiner

*Primary Examiner*—Tuan T. Lam
*Assistant Examiner*—Hiep Nguyen
(74) *Attorney, Agent, or Firm*—Staas & Halsey LLP (57) ABSTRACT

At least two inputs, at least one output and a clock source for the inputs are provided in a multiplexer. Each input balances an input signal and is coupled to a transistor circuit having two transistors with collectors commonly connected to a power potential. The transistor circuit can be supplied with a first balanced input signal on a first input signal path connected to the base of the first transistor, and with a second balanced input signal on a second input signal path connected to the base of the second transistor. The two balanced input signals are able to have a predetermined switching potential applied to them under the clocking of a driver circuit. In addition, two outgoing signal paths from the emitter of each transistor circuit can be combined to form at least two output signal paths for the at least one output. In this arrangement, the two output signal paths can be connected symmetrically with respect to a reference-ground potential.

29 Claims, 5 Drawing Sheets

MULTIPLEXER WITH CLOCK SUPPRESSION

CROSS REFERENCE TO RELATED APPLICATIONS

This application is based on and hereby claims priority to German Application No. 103 47 640.7 filed on 9 Oct. 2003, the contents of which are hereby incorporated by reference.

BACKGROUND OF THE INVENTION

1. Field of the Invention

The invention relates to a multiplexer which has at least two inputs, at least one output and a clock for the inputs, as disclosed in DE 38 08 036 A1.

2. Description of the Related Art

Multiplexers are used in circuits when the aim is to concentrate a plurality of channels onto one common channel. If one wishes to digitize N analog channels, for example, this normally requires N analog/digital (A/D) converters. Using a multiplexer, all N analog channels can be time-division multiplexed onto a common analog channel and digitized by a single A/D converter. Since N A/D converters are normally more expensive than a single, N times faster A/D converter, this involves a cost saving. Added to this is the fact that the layout of a circuit is significantly simplified by omitting N-1 lines and N-1 A/D converters.

Signal critical applications in magnetic resonance (MR) installations, for example, require the use of multiplexers which meet particularly high demands, since this presupposes that a high signal quality is obtained during the signal processing. Preferably, a multiplexer should have a high level of channel separation for this purpose, so that crosstalk is kept as low as possible. The multiplexer should also be able to process a correspondingly high level of dynamics of at least 100 dB and should be able to be operated at high clock rates in the region of 40 MHz. At a clock rate of 40 MHz, the time for turning on and off should be no more than 5 ns, assuming a turn-on duration of 15 ns. When analog signal compression is used between multiplexer and A/D converter in order to reduce the bit depth of the A/D converter, the multiplexer should be able to suppress the multiplex clock, i.e. the switching clock and many of its harmonics, to a sufficient extent, since otherwise the compressor is being modulated in the nonlinear range, and the expansion back to the original useful signals becomes erroneous.

Most known multiplexers are integrated chips and are based to a large extent on CMOS technology. Normally, however, they do not meet at least one of the demands mentioned above. By way of example, although the four-to-one multiplexer MAX4559 from Maxim Integrated Products, Inc. has a channel separation of 60 dB and above at 2 MHz, it requires approximately 150 ns just for turning on or off. The series ADG781, ADG782 and ADG783 multiplexers from Analog Devices, Inc., with a turn-on time of 16 ns and a turn-off time of 10 ns, are an order of magnitude faster than the aforementioned multiplexers, which nevertheless does not meet the demands cited above. Even the switching clock suppression does not meet these high demands in all of the examples cited.

DE 38 08 036 A1 discloses a multiplexer for combining four digital signals over time to form one output signal. In this case, the multiplexer contains four signal transistors which each have an emitter connection, four clock transistors which each have two emitter connections, and a multi-emitter transistor with four emitter connections. In this arrangement, the emitters of the signal transistors are connected in a particular manner to the emitters of the double emitter clock transistors and to the four emitter connections of the four-way multi-emitter transistor. The collector connection of the multi-emitter transistor is the signal output of the multiplexer in this case. To generate balanced output signals, an emitter-coupled differential amplifier may be connected to the signal output. For this multiplexer circuit based on emitter followers, however, there is no provision for switching clock suppression and no provision for multiplexing analog signals.

In the field of electronic balanced and bridge mixers, "ring modulators", balanced or bridge arrangements of symmetrical design are known for suppressing a local oscillator signal (cf. book by Zinke, Brunswig: "Hochfrequenztechnik 2" [Radio-frequency engineering 2], 5th Edition, Springer-Verlag (DE), 1999, pages 492 to 494). Problems with such mixers cannot readily be transferred to multiplexers.

SUMMARY OF THE INVENTION

It is an object of the present invention to provide a multiplexer having at least two inputs, at least one output and a clock for the inputs and which ensures a high level of channel separation.

It is another object of the present invention to provide such a multiplexer which can process a high level of dynamics.

It is a further object of the present invention to provide such a multiplexer which can be operated at high clock rates and can suppress the switching clock and many of its harmonics at least to a large extent.

The inventive multiplexer is wherein each input balances an input signal, thus, including balancing means and a transistor circuit. This transistor circuit has at least two transistors whose collectors are connected to one another and have a potential applied to them. The transistor circuit can be supplied with a first balanced input signal on a first input signal path connected to the base of the first transistor, and with a second balanced input signal on a second input signal path connected to the base of the second transistor, the two balanced input signals being able to have a predetermined switching potential applied to them under the clocking of a driver circuit. In addition, the inventive multiplexer is wherein two outgoing signal paths coming from the emitter of each transistor circuit can be combined to form at least two output signal paths for the at least one output. In this case, the two output signal paths can be connected symmetrically with respect to a reference-ground potential.

In this context, the invention is based on the insight that when transmitting normal-mode signals it is possible to suppress interfering common-mode signals when a system with a high level of common-mode rejection is used. When applied to the multiplexer, this means that the signals to be switched are input and output as normal-mode signals, while the multiplex clock and hence the digital switching signal is fed in as a common-mode signal. This allows switching clock suppression to be achieved with simultaneously high channel separation, a high level of processible dynamics and high clock rates.

Preferably, the switching potential can be applied to the input signal paths symmetrically. This ensures that the two input signal paths are subject to the same potential conditions, which means that the switching signal can arrive at the transistor circuit at the same time via two input signal paths.

Advantageously, the two output signal paths are connected to the reference-ground potential via at least one inductance provided with a center tap and via at least one resistor connected to the center tap. This means that the at least one inductance acts as a balancing inductor which is responsible for the controlled switching clock attenuation at the output when the two inductance halves are coupled as firmly as possible.

Preferably, the as yet unbalanced input signal can be supplied to the primary winding of a transformer. In this case, the latter's secondary winding is connected to the input signal paths. This is a reliable way of effectively balancing an input signal. Just one transformer is required whose primary winding is connected by its second supply line to a reference-ground potential, particularly the ground potential.

Preferably, the switching potential can be supplied via a center tap on an inductance which connects the two input signal paths and is provided with the center tap. In this case, the at least one inductance acts as a balancing inductor which ensures that the switching signal can arrive at the transistor circuit undelayed and at the same time via the two input signal paths and simultaneously represents the required direct current path.

In this case, it is advantageous for the at least one inductance connecting the two input signal paths to be the secondary winding of the transformer. A corresponding design is easy to produce, since the transformer already incorporates an appropriate inductance in the form of the secondary winding. This means that it is possible to dispense with additional inductances and signal paths.

Equally, one variant is possible in which a respective low-pass filter for the two input signal paths is arranged between the secondary winding of the transformer and the at least one inductance connecting the two input signal paths. This has the advantage that the switching signal, which is always at a much higher frequency than the input signals which are to be multiplexed, can be kept away from the feed circuit in the reverse direction by the pair of low-pass filters.

In this case, it is advantageous for at least one inductance in the low-pass filters to be variable. Hence, in order to achieve optimum switching clock suppression, the amplitude of the switching pulse can be balanced out exactly on the activated transistor circuit.

Preferably, the transformer is produced with an annular core which permits good magnetic coupling between the primary and secondary windings at the same time as low capacitive coupling.

A further advantageous refinement of the multiplexer based on the invention is that the switching potential can be supplied to each of the two input signal paths via a parallel circuit having at least one resistor and at least one capacitance. The at least one capacitance forwards the switching pulse undelayed to the base electrodes of the transistor circuit, while the at least one resistor represents the required direct current path.

In this case, it is advantageous for a respective low-pass filter for the two input signal paths to be arranged between the balancing means and the supply of the switching potential. This has the advantage that the switching signal, which is always at a much higher frequency than the input signals which are to be multiplexed, can be kept away from the feed circuit in the reverse direction by the pair of low-pass filters.

In this arrangement, it is advantageous for at least one inductance in the low-pass filters to be variable. Hence, to achieve optimum switching clock suppression, the amplitude of the switching pulse can be balanced out exactly on the activated transistor circuit.

Advantageously, a bandpass filter for the two input signal paths is arranged between the balancing means and the supply of the switching potential. In many cases, such as in the field of MRI (Magnetic Resonance Imaging), the input signal to be multiplexed is a bandpass signal. In that case, to keep the switching signals away from the feed circuit, it is preferable to use a bandpass filter which is tuned to the bandwidth of the input signals. This makes it possible to keep away, by way of example, interfering parasitic low-frequency signals which are not input signals.

In this case, it is advantageous for at least one inductance in the bandpass filter to be variable. Thus, firstly, in order to achieve optimum switching clock suppression, the amplitude of the switching pulse can be balanced out exactly on the activated transistor circuit. Secondly, the desired frequency response for the input signal can be set while the switching clock suppression is simultaneously at a maximum if at least one inductance in the two series paths is respectively variable.

In this case, it is advantageous for at least one capacitance in the bandpass filter to be variable in order to obtain a further way of being able to set the bandpass filter exactly.

Advantageously, the balanced input signal can be supplied to the bandpass filter using an input transformer. A corresponding design is easy to produce, since the secondary winding of the input transformer is thus simultaneously incorporated as an inductance in the bandpass filter.

In this context, it is advantageous for the input transformer to be produced with an annular core which permits good magnetic coupling between the primary and secondary windings and simultaneously low capacitive coupling.

It is advantageous for the supply of the switching potential and the bandpass filter to form a third order bandpass filter which allows the requisite passband to be set with maximum attenuation of the other frequencies, in line with the high demands.

It is particularly advantageous for the at least two resistors in the two parallel circuits, via which the switching potential can be supplied to each of the two input signal paths, to be designed as a characteristic resistance termination. This means that the low-pass filter or else the bandpass filter can be terminated using the resistors situated between the base connections in order to achieve a specifically desired frequency characteristic with the characteristic resistance which is required for this purpose.

Advantageously, the balancing means is a differential amplifier which can also be used for effectively balancing, inter alia, low-frequency input signals of below 10 kHz in a simple manner.

BRIEF DESCRIPTION OF THE DRAWINGS

These and other objects and advantages of the present invention will become more apparent and more readily appreciated from the following description of the preferred, but in no way restrictive, exemplary embodiments, taken in conjunction with the accompanying drawings of which.

DETAILED DESCRIPTION OF THE PREFERRED EMBODIMENTS

Reference will now be made in detail to the preferred embodiments of the present invention, examples of which are illustrated in the accompanying drawings, wherein like reference numerals refer to like elements throughout.

Figure 1:
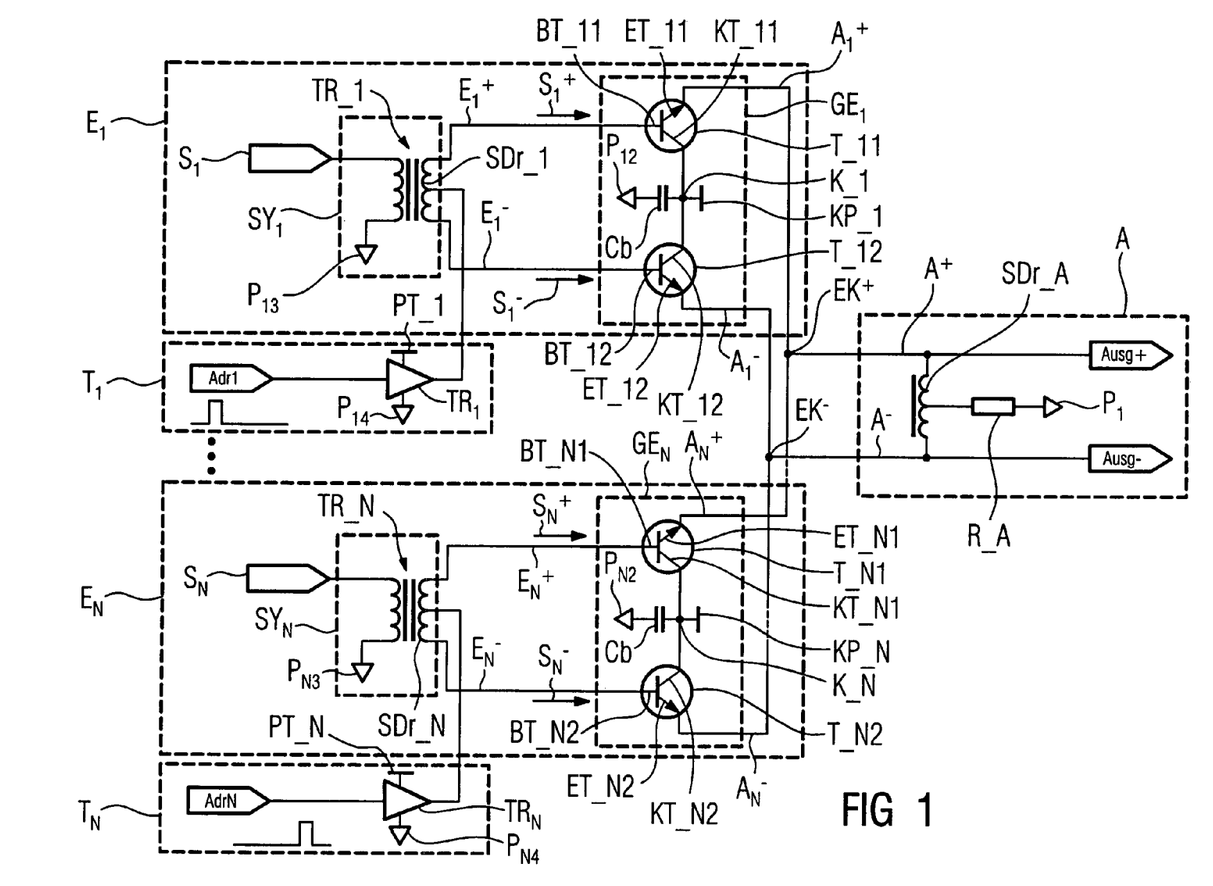
FIG. 1 is a circuit diagram of a basic embodiment of a multiplexer having N inputs, an output and clocking means.

FIG. 1 shows the basic embodiment of a multiplexer having N inputs $E_1$ to $E_N$, an output A and driver circuits $TR_1$ to $TR_N$ in clocking means $T_1$ to $T_N$. The first and the Nth stage, i.e., the last stage are illustrated, along with the common output A.

An input signal $S_n$ fed in at the n-th (n=1 to N) input $E_n$ is supplied, using balancing circuit $SY_n$, which includes a transformer TR_n in this exemplary embodiment, to two base electrodes BT_n1 and BT_n2 on two transistors T_n1 and T_n2 via two input signal paths $E_n^+$ and $E_n^-$ as a balanced input signal $S_n^+$ and $S_n^-$. In this case, it is advantageous to use transistors T_n1 and T_n2 which are as identical as possible. "Double transistors" are particularly suitable for this purpose. FIG. 1 also shows that the two transistors T_n1 and T_n2 are arranged to form a transistor circuit $GE_n$ in which the collector electrodes KT_n1 and KT_n2 of the transistor pair T_n1 and T_n2 are connected to one another. This connection between the two collector electrodes KT_n1 and KT_n2 is also connected, at a node point K_n, both to a potential KP_n and, via a capacitance Cb which has a low impedance for high frequencies, to a reference-ground potential $P_{n2}$, preferably the ground potential. The two collectors KT_n1 and KT_n2 of the transistor pair T_n1 and T_n2 are thus at a common, particularly a constant, potential KP_n of +5V, for example.

To activate the n-th stage, a driver circuit $TR_n$ connected to a potential PT_n is used to supply a switching pulse to the center tap of an inductance SDr_n which is connected to the two input signal paths $E_n^+$ and $E_n^-$. In this exemplary embodiment, the inductance SDr_n is also simultaneously the secondary of the transformer Tr_n. In this case, the level of the corresponding switching potential is provided by the potential PT_n of +3V, for example. In line with the Nyquist-Shannon sampling theorem, the clock rate must always be chosen to be higher than the frequency of the input signal which is fed in, and for the multiplexer based on the invention is in the range between 100 kHz and 10 GHz. An example of one possible driver circuit $TR_n$ which is suitable is the CMOS driver: 74AC573 from STMicroelectronics, Geneva, Switzerland.

During operation of the multiplexer, the N driver circuits $Tr_1$ to $Tr_N$ in the individual N stages are actuated by addressing pulses Adr1 to AdrN such that one of the N switching pulses is always at "High" (in this case +3V, for example) and hence the corresponding stage is activated, while the other N-1 switching pulses are "Low" (e.g. 0V).

If the two winding halves of the transformer TR_n are permanently coupled, then the flows caused by the switching pulse compensate for one another, i.e. the pulse encounters no inductance and is therefore delay-free on the base electrodes BT_n1 and BT_n2 of the transistor circuit $GE_n$. The transistor pair T_n1 and T_n2 activated as a result thus forwards the balanced input signal $S_n^+$ and $S_n^-$, having changed impedance, first via the output signal paths $A_n^+$ and $A_n^-$ which come from the transistor circuit $GE_n$ and are connected to the corresponding emitter electrodes ET_n1 and ET_n2 of the transistor pair T_n1 and T_n2, and then, after concentration, via the output signal paths $A^+$ and $A^-$ to the common inductance SDr_A at the output A. In this case, the inductance SDr_A acts as a balancing inductor. The more permanent the coupling between the latter's winding halves, the better the shorting and hence suppression of common-mode residues of the switching pulse between the output signal paths $A^+$ and $A^-$. In this case, the inductance SDr_A is connected by a center tap via a resistor R_A to the reference-ground potential $P_1$, which is the ground potential, in particular, which resistor stipulates the quiescent current in the two activated transistors T_n1 and T_n2.

Since a transistor circuit $GE_n$ is always activated and the corresponding emitters ET_n1 and ET_n2 of all of the N stages are connected to one another, these are at a common potential, in this example approximately +2.3V. That is the "High" level of the activating switching pulse of +3V which is assumed in the example reduced by the base/emitter forward voltage of approximately 0.7V, for example. All of the base electrodes BT_n1 and BT_n2 of the N-1 unactivated transistor pairs T_n1 and T_n2 are at 0V, the "Low" level, on average over time, however. This has the currently applied balanced input signal $S_n^+$ and $S_n^-$ superimposed on it. While this signal on the base electrodes BT_n1 and BT_n2 is below +2.0V, for example, the unactivated base/emitter paths remain securely reverse biased. In this example, the normal-mode level between two base electrodes BT_n1 and BT_n2 can thus safely assume a voltage difference of up to 8 Vpp (Vpp: "peak-to-peak" voltage) between the voltage peaks of the two balanced input signals $S_n^+$ and $S_n^-$.

To estimate the insulation in the turned-off state, a source resistance for the input signal between the base electrodes BT_n1 and BT_n2 of 200 Ω, for example, is assumed. For a current gain of β=100, this signal at the emitter nodes $EK^+$ and $EK^-$ then appears with a dynamic source resistance of 2 Ω. A reverse biased base/emitter path has a residual capacitance of 1 pF, for example. A turned-off signal thus appears at the two emitter nodes $EK^+$ and $EK^-$ as if it had an internal resistance of 0.5 pF. In theory, at 1 MHz this corresponds to a stop-band attenuation of over 100 dB $$\text{on the basis of} \frac{\omega RC}{\sqrt{1+(\omega RC)^2}} \approx \omega RC \text{ for } \omega \ll \frac{1}{RC}.$$

For good stop-band attenuation, it should also be ensured that the inductance value of the inductance SDr_A on the output side is chosen to be large enough.

To estimate the dynamics, reference will again be made to the "peak-to-peak" voltage 8 $V_{pp}$. Any noise components in the switching pulse cancel each other out on account of the switching pulse's common-mode character. The N-1 deactivated transistor pairs also contribute virtually nothing to the noise. Hence, essentially the noise contribution of the voltage noise in the activated transistor pair T_n1 and T_n2 remains. A somewhat low noise bipolar transistor has, by way of example, an equivalent input noise voltage density of 2 $nV_{eff}/\sqrt{Hz}$ ($V_{eff}$: "effective" voltage). This corresponds to a normal-mode value of 2 $nV_{eff}/\sqrt{Hz}$ on account of the correlation freedom of the two activated transistors T_n1 and T_n2, which corresponds to an effective voltage of $2\sqrt{2}\,\mu V_{\mathit{eff}}$ for a signal having a width of 1 MHz, for example. $8\,V_{pp}=2\sqrt{2}\,V_{\mathit{eff}}$ thus results in dynamics of 120 dB for this example.

For good switching clock suppression, it is fundamental for the switching pulse to arrive at the two base electrodes BT_n1 and BT_n2 of a transistor pair T_n1 and T_n2 as close as possible to simultaneously and with the same amplitude. A certain asymmetry may now be caused in FIG. 1 by the capacitive coupling between the primary and secondary windings of the transformer TR_n. It is therefore important to design the transformer TR_n particularly to have an annular core, which permits good magnetic coupling and simultaneously low capacitive coupling. In FIG. 1, $P_{13}$ also denotes a reference-ground potential, preferably the ground potential, $P_{14}$ denotes a reference-ground potential, preferably the ground potential, and Outp+ and Outp– denote the balanced output signal.

Figure 2:
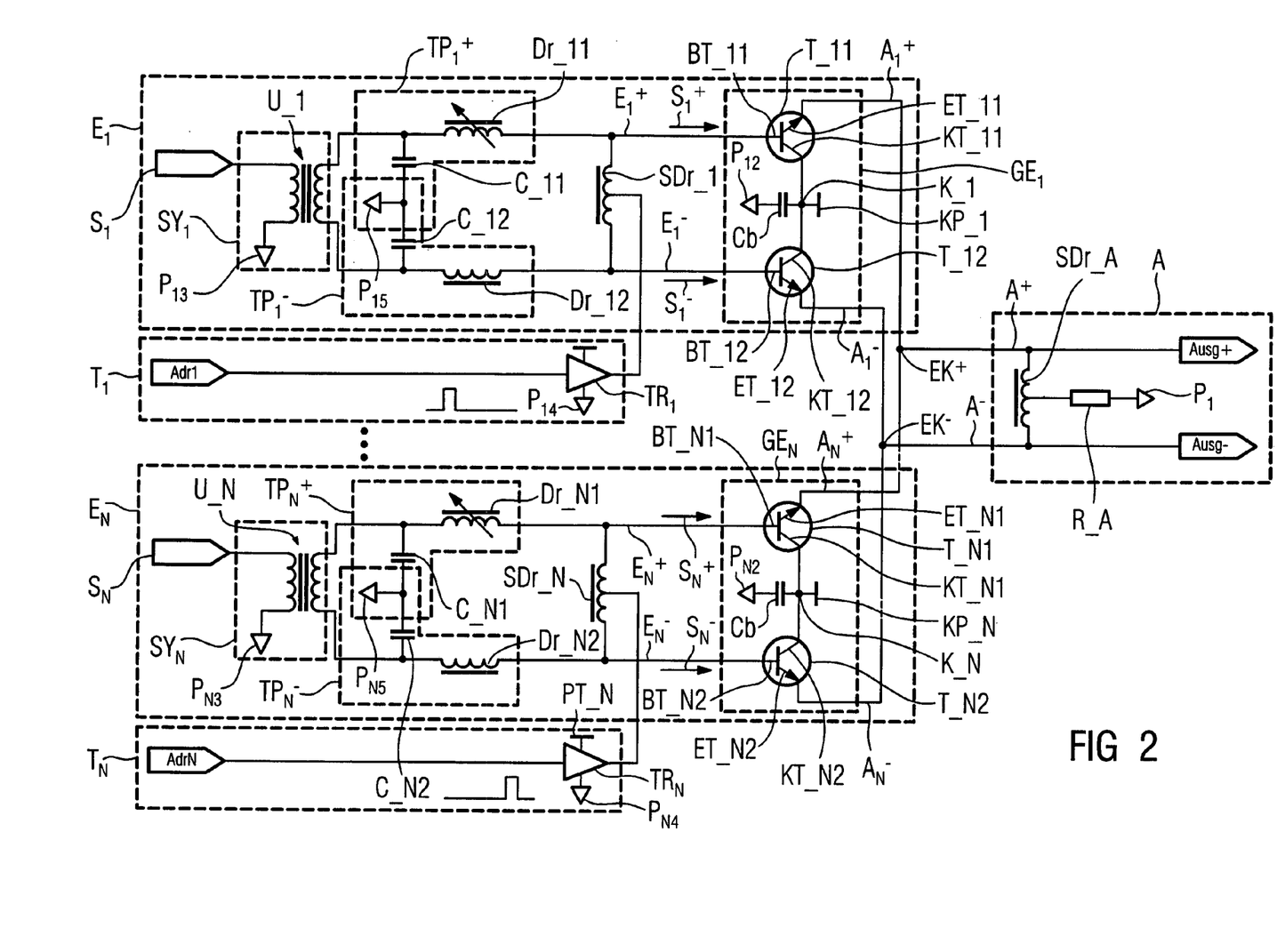
FIG. 2 is a circuit diagram of a multiplexer having low-pass filters for attenuating the switching pulse in the reverse direction.

FIG. 2 shows a further circuit arrangement. The transformer U_n corresponds essentially to the transformer TR_n. The difference is merely that the transformer U_n is not provided with a center tap, as the transformer TR_n is. In this exemplary embodiment, the switching pulse is therefore fed in via an inductance SDr_n provided with a center tap, the inductance not being part of the transformer U_n, but rather being arranged separately therefrom. Since the switching pulse is always at a much higher frequency than the input signals $S_n$ which are to be multiplexed, it can be kept away from the feed circuit in the reverse direction by two low-pass filters $TP_n^+$ and $TP_n^-$, in this case including the inductances Dr_n1, Dr_n2 and the capacitances C_n1, C_n2. The capacitive coupling between the windings in the transformer U_n is then largely noncritical, in contrast to the transformer TR_n from the circuit arrangement in FIG. 1. In this context, the balancing of the input signal $S_n$ is additionally supported by the capacitances C_n1 and C_n2, which for this reason should have values which are as identical as possible. If one inductance in the pair Dr_n1 and Dr_n2 is in variable form, then it is thus possible to balance out the amplitude of the switching pulse on the base electrodes BT_n1 and BT_n2 of the activated transistor pair T_n1 and T_n2 exactly in the interest of optimum switching clock suppression. In FIG. 2, $P_{15}$ also denotes a reference-ground potential, preferably the ground potential.

Figure 3:
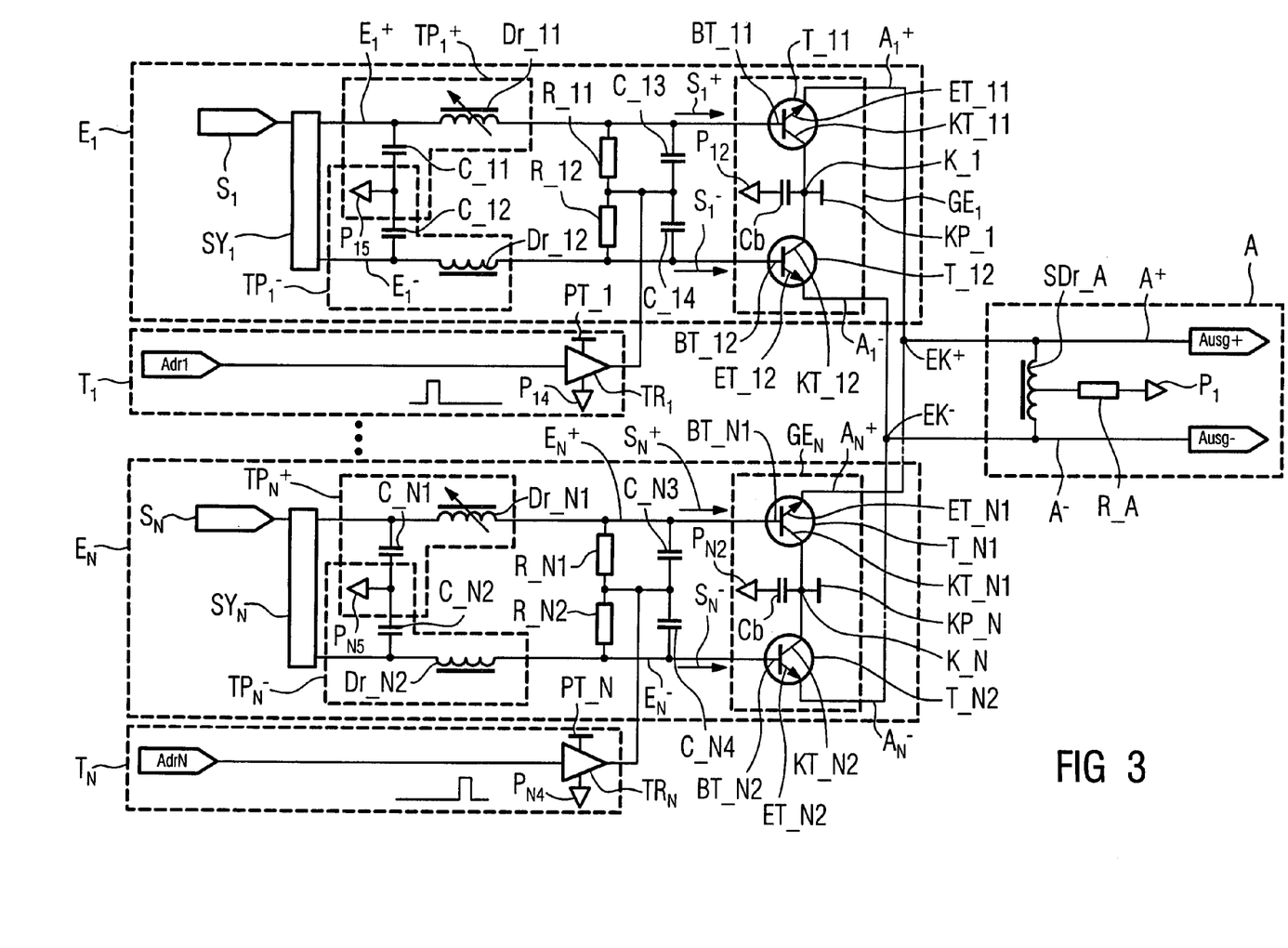
FIG. 3 is a circuit diagram of a multiplexer having low-pass filters for attenuating the switching pulse in the reverse direction permissibly low-frequency input frequency range up to DC.

For the input signal $S_n$, the transformer U_n and the inductance SDr_n have a high-pass filter character. It is thus more difficult to transmit low frequencies at below 10 kHz. For such applications, there is better suitability in a circuit modification, as shown in FIG. 3. In this arrangement, the inductance SDr_n is replaced via the resistors R_n1 =R_n2 and the capacitances C_n3=C_n4. The latter forward the switching pulse undelayed to the base electrodes BT_n1 and BT_n2 of the transistor circuit GE$_n$, while the former represent the required direct current path. The input signal $S_n$ may be balanced using a differential amplifier with a current output, for example. Alternatively, an appropriate transformer U_n as shown in FIG. 2 is conceivable. With suitable proportioning of the capacitances C_n1=C_n2 and C_—n3=C_n4, of the inductances Dr_n1=Dr_n2, of the resistors R_n1=R_n2 and of the source resistance, the spectral range can be specifically limited at the top. To this end, these components are chosen such that they represent a particular balanced third order low-pass filter, for example a Tschebyscheff low-pass filter. Higher filter orders are also conceivable.

In many cases, such as in the MRI field, the input signal $S_n$ to be multiplexed is a bandpass signal. In that case, the low-pass filter structure specified above may also be in the form of a bandpass filter. To provide a better understanding, FIG. 4 first of all shows a balanced third order bandpass filter.

In the majority of all cases, such a filter balanced to ground is also produced symmetrically with respect to the signal direction, in which case L_BP_1=L_BP_4 applies to the inductances and C_BP_1=C applies to the capacitances. The input resistance then corresponds to the resistance R when the latter is chosen to be equal to the characteristic resistance. As may also be seen in FIG. 4, only normal-mode signals with the appropriate filter characteristic are attenuated, while the shunt paths containing the inductances L_BP_1 and L_BP_4, containing the capacitances C_BP_1 and C and containing the resistor R remain inactive for common-mode signals.

Figure 4:
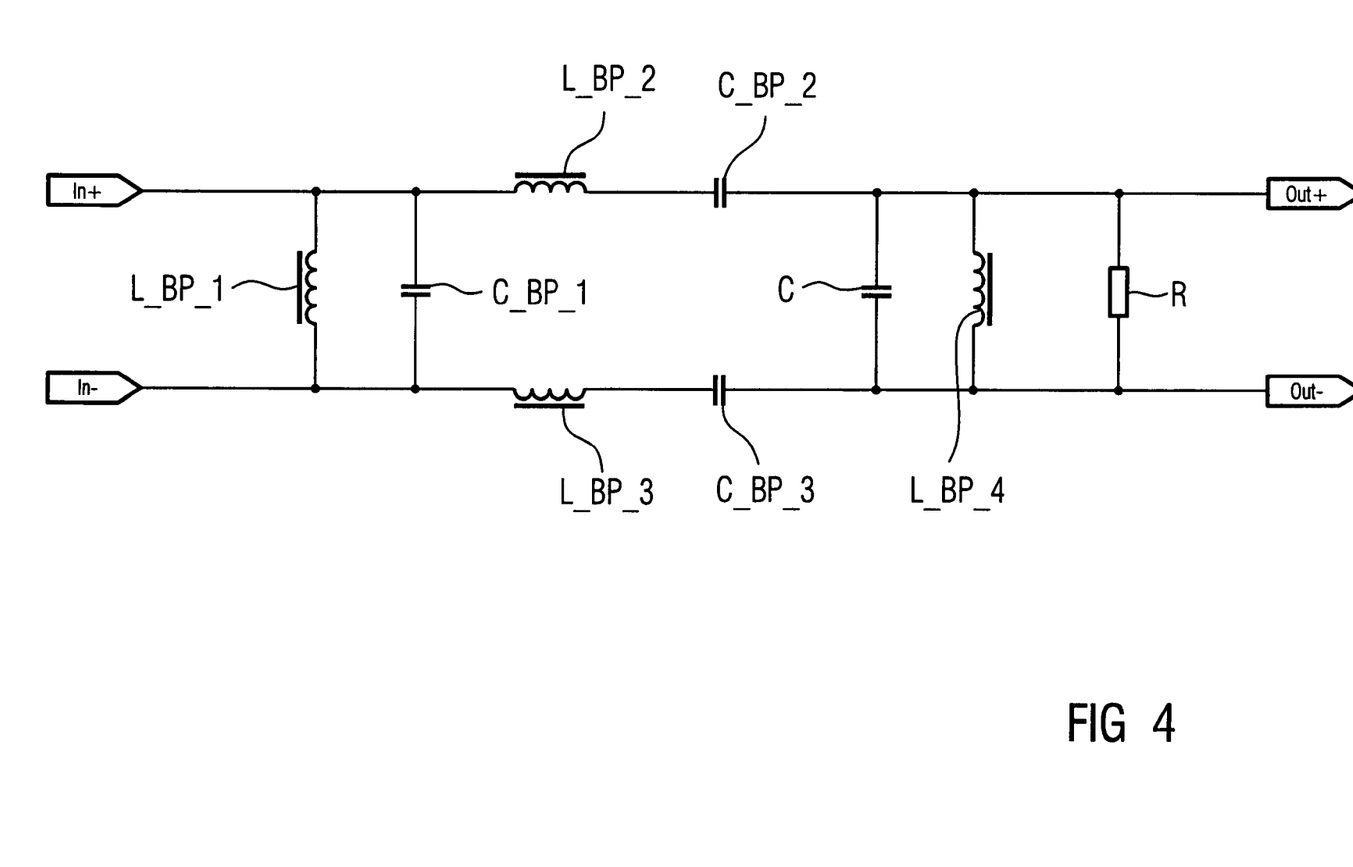
FIG. 4 is a circuit diagram of a balanced third order bandpass filter.
Figure 5:
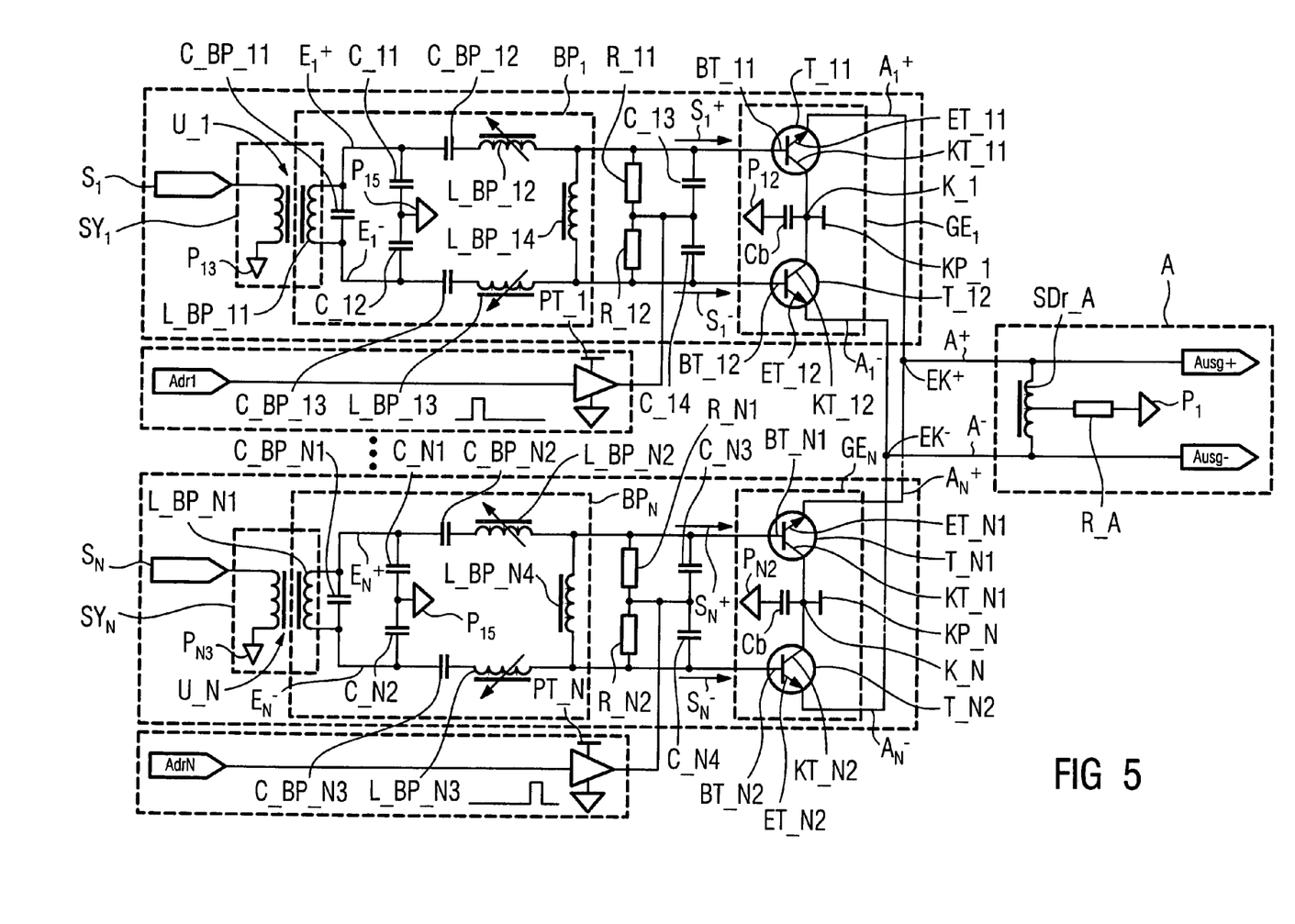
FIG. 5 is a circuit diagram of a multiplexer having a bandpass filter for attenuating the switching pulse in the reverse direction.

The bandpass filter which is suitable for use in the multiplexer needs to be slightly modified so that the attenuation of the switching clock is not reduced too greatly in the reverse direction. Such a bandpass filter (BP$_n$) is shown in FIG. 5. The largest portion of the required capacitance C_BP_1 from FIG. 4 is represented in this case in the capacitance C_BP_n1, with the remainder being equally divided in the capacitances C_n1=C_n2. The following must therefore apply:

$C\_BP\_1=C\_BP\_n1+(C\_n1)/2.$

C_n1 =C_n2 are chosen to be just of a magnitude such that the switching clock attenuation in the reverse direction reaches an extent which allows the capacitive coupling in the input transformer U_n with the secondary inductance L_BP_n1 to become noncritical. In practice, the capacitance C_n1 is chosen to be approximately 5% of the capacitance C_BP_n1. It is also possible to omit the capacitance C_BP_n1 entirely. For this, the following must apply for the corresponding capacitances:

$C\_n1=C\_n2=2\,C\_BP\_1.$

However, this requires components with very narrow tolerances. Since the inductance SDr_A on the output side forces a fully balanced signal, a slight asymmetry introduced on the input side at a high modulation level may bring about very large emitter currents which result in signal distortions.

In addition, a comparison of FIGS. 4 and 5 reveals that the following applies for the capacitances:

$C\_n3=C\_n4=2\,C$ and the following applies for the resistors:

$R\_n1=R\_n2=R/2$

To set the bandpass filter (BP$_n$) precisely, the inductance L_BP_n1, or alternatively the capacitance C_BP_n1 and the inductance L_BP_n4, in the shunt paths may be in variable form. In the series paths, preferably both inductances L_BP_n2 and L_BP_n3 can be be trimmed, since then the desired frequency response for the balanced input signal $S_n^+$ and $S_n^-$ remains variable while switching clock suppression is simultaneously at a maximum.

In all of the exemplary embodiments cited above, the input signal $S_n$ which is fed in is preferably an analog input signal. However, it is also readily conceivable for a digital input signal to be used. The embodiments of the inventive multiplexer which are cited above do not have any restrictions in this regard.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

What is claimed is:

1. A multiplexer coupled to power and reference ground potentials and to receive unbalanced input signals, comprising:
    at least two inputs receiving the unbalanced input signals;
    at least one output;
    balancing means for balancing the unbalanced input signals received by said at least two inputs and producing at least first and second balanced input signals;
    a driver circuit clocking the inputs and applying a predetermined switching potential to the at least first and second balanced input signals under the clocking of said driver circuit;
    a transistor circuit having at least first and second transistors with interconnected collectors receiving the power potential, said first transistor having a base coupled via a first input signal path to said balancing means to receive the first balanced input signal and having an emitter, and said second transistor having a base coupled via a second input signal path to said balancing means to receive the second balanced input signal and having an emitter; and
    at least first and second outgoing signal paths from the emitter of said at least first and second transistors, respectively, combinable to form at least two output signal paths for the at least one output, the at least two output signal paths being connected symmetrically with respect to the reference-ground potential.

2. The multiplexer as claimed in claim 1, wherein the predetermined switching potential is applied to the first and second input signal paths symmetrically.

3. The multiplexer as claimed in claim 2, wherein the at least two output signal paths include
    at least one output inductance with a center tap; and
    at least one resistor connecting the center tap of the at least one output inductance to the reference-ground potential.

4. The multiplexer as claimed in claim 3, wherein said balancing means includes a transformer with a primary winding receiving each unbalanced input signal and a secondary winding connected to the first and second input signal paths.

5. The multiplexer as claimed in claim 4, wherein the secondary winding of said transformer has a center tap to which the predetermined switching potential is applied.

6. The multiplexer as claimed in claim 4, wherein said transformer has an annular core.

7. The multiplexer as claimed in claim 4, further comprising at least one input inductance connecting the first and second input signal paths and having a center tap to which the predetermined switching potential is applied.

8. The multiplexer as claimed in claim 7, further comprising first and second low-pass filters for the first and second input signal paths, respectively, arranged between the secondary winding of said transformer and the at least one input inductance.

9. The multiplexer as claimed in claim 8, wherein said first and second low-pass filters each includes at least one variable inductance.

10. The multiplexer as claimed in claim 9, wherein said transformer has an annular core.

11. The multiplexer as claimed in claim 3, further comprising a switching potential supply circuit formed by first and second parallel circuits, each having at least one resistor and at least one capacitance, supplying the switching potential to the first and second input signal paths, respectively.

12. The multiplexer as claimed in claim 11, further comprising first and second low-pass filters for the first and second input signal paths, respectively, arranged between said balancing means and said switching potential supply circuit.

13. The multiplexer as claimed in claim 12, wherein said first and second low-pass filters each includes at least one variable inductance.

14. The multiplexer as claimed in claim 11, further comprising a bandpass filter for the first and second input signal paths arranged between said balancing means and said switching potential supply circuit.

15. The multiplexer as claimed in claim 14, wherein said bandpass filter includes at least one variable inductance.

16. The multiplexer as claimed in claim 15, wherein said bandpass filter further includes at least one variable capacitance.

17. The multiplexer as claimed in claim 16, wherein said balancing means includes an input transformer supplying the first and second balanced input signals to said bandpass filter.

18. The multiplexer as claimed in claim 17, wherein said input transformer has an annular core.

19. The multiplexer as claimed in claim 18, wherein said switching potential supply circuit and said bandpass filter form a third order bandpass filter.

20. The multiplexer as claimed in claim 19, wherein the at least one resistor in each of the first and second parallel circuits in said switching potential supply circuit, provide a characteristic resistance termination.

21. The multiplexer as claimed in claim 20, wherein said balancing means includes a differential amplifier.

22. The multiplexer as claimed in claim 14, wherein said bandpass filter further includes at least one variable capacitance.

23. The multiplexer as claimed in claim 14, wherein said balancing means includes an input transformer supplying the first and second balanced input signals to said bandpass filter.

24. The multiplexer as claimed in claim 14, wherein said switching potential supply circuit and said bandpass filter form a third order bandpass filter.

25. The multiplexer as claimed in claim 11, wherein the at least one resistor in each of the first and second parallel circuits in said switching potential supply circuit, provide a characteristic resistance termination.

26. The multiplexer as claimed in claim 11, wherein said balancing means includes a differential amplifier.

27. The multiplexer as claimed in claim 1, wherein the at least two output signal paths include at least one output inductance with a center tap; and
    at least one resistor connecting the center tap of the at least one output inductance to the reference-ground potential.

28. The multiplexer as claimed in claim 1, wherein said balancing means includes a transformer with a primary winding receiving each unbalanced input signal and a secondary winding connected to the first and second input signal paths.

29. The multiplexer as claimed in claim 1, further comprising a switching potential supply circuit formed by first and second parallel circuits, each having at least one resistor and at least one capacitance, supplying the switching potential to the first and second input signal paths, respectively.

* * * * *